(12) United States Patent
Ota et al.

(10) Patent No.: US 7,138,660 B2
(45) Date of Patent: Nov. 21, 2006

(54) LIGHT EMITTING DEVICE

(75) Inventors: Koichi Ota, Aichi-ken (JP); Atsuo Hirano, Aichi-ken (JP); Akihito Ota, Aichi-ken (JP); Stefan Tasch, Jennersdorf (AT); Peter Pachler, Graz (AT); Gundula Roth, Levenhagen (DE); Walter Tews, Greifswald (DE); Wolfgang Kempfert, Bad Liebenstein (DE); Detlef Starick, Bad Liebenstein (DE)

(73) Assignees: Toyoda Gosei Co., Ltd., Aichi (JP); Tridonic Optoelectronics GmbH, Jennersdorf (AT); Litec GBR, Greifswald (DE); Leuchtstoffwerk Breitungen GmbH, Breitunge (DE)

( * ) Notice: Subject to any disclaimer, the term of this patent is extended or adjusted under 35 U.S.C. 154(b) by 0 days.

(21) Appl. No.: 11/087,579

(22) Filed: Mar. 24, 2005

(65) Prior Publication Data
US 2005/0162069 A1    Jul. 28, 2005

Related U.S. Application Data

(62) Division of application No. 10/451,864, filed on Jun. 30, 2003, now Pat. No. 6,943,380.

(51) Int. Cl.
*H01L 27/15* (2006.01)

(52) U.S. Cl. .................. 257/79; 257/98; 257/E33.001; 257/E31.099

(58) Field of Classification Search .................. 257/13, 257/79, 82, 88, 89, 98–100, 676, E33.001, 257/E31.099, E25.032; 438/FOR. 157, FOR. 287; 313/467; 315/375, 376
See application file for complete search history.

(56) References Cited

U.S. PATENT DOCUMENTS

| 2,297,108 A | 9/1942 | McKeng et al. |
| 4,661,419 A | 4/1987 | Nakamura |

(Continued)

FOREIGN PATENT DOCUMENTS

EP    1 020 935 A2    7/2000

(Continued)

OTHER PUBLICATIONS

International Search Report dated Mar. 14, 2002 and English translation of the degree of relevance found.

(Continued)

*Primary Examiner*—Brook Kebede
(74) *Attorney, Agent, or Firm*—McGinn IP Law Group, PLLC

(57) ABSTRACT

The light emitting device has a light emitting diode which is made of a nitride semiconductor and a phosphor which absorbs a part of lights emitted from the light emitting diode and emits different lights with wavelengths other than those of the absorbed lights. The phosphor is made of alkaline earth metal silicate fluorescent material activated with europium.

13 Claims, 7 Drawing Sheets

U.S. PATENT DOCUMENTS

| | | | |
|---|---|---|---|
| 5,939,735 A | 8/1999 | Tsutsui et al. | |
| 5,998,925 A | 12/1999 | Shimizu et al. | |
| 6,046,465 A | 4/2000 | Wang et al. | |
| 6,066,861 A | 5/2000 | Hohn et al. | |
| 6,084,250 A | 7/2000 | Justel et al. | |
| 6,252,254 B1 | 6/2001 | Soules et al. | |
| 6,576,930 B1 | 6/2001 | Soules et al. | |
| 6,614,179 B1 * | 9/2003 | Shimizu et al. | 313/512 |
| 6,649,946 B1 | 11/2003 | Bogner et al. | |
| 6,809,347 B1 * | 10/2004 | Tasch et al. | 257/103 |
| 2001/0000622 A1 | 5/2001 | Reeh et al. | |
| 2004/0007961 A1 | 1/2004 | Srivastava et al. | |

FOREIGN PATENT DOCUMENTS

| | | |
|---|---|---|
| EP | 1 167 872 A1 | 1/2002 |
| JP | 54-119381 | 9/1979 |
| JP | 60-013882 | 1/1985 |
| JP | 62-44792 B | 9/1987 |
| JP | 62-277488 | 12/1987 |
| JP | 10-188649 | 7/1998 |
| JP | 2907286 | 4/1999 |
| JP | 2000-49389 | 2/2000 |
| JP | A 2000-150966 | 5/2000 |
| JP | 2000-174346 | 6/2000 |
| JP | A 2000-510647 | 8/2000 |
| JP | 2000-248280 | 9/2000 |
| JP | 2000-269555 | 9/2000 |
| JP | 2000-345152 | 12/2000 |
| JP | 2000-349345 | 12/2000 |
| JP | A 2000-349346 | 12/2000 |
| JP | 2001-217461 | 8/2001 |
| JP | A 2004-501512 | 1/2004 |
| WO | WO 97/50132 | 12/1997 |
| WO | WO 98/12757 | 3/1998 |
| WO | WO 00/05078 | 2/2000 |
| WO | WO 00/33389 | 6/2000 |
| WO | WO 00/33390 | 6/2000 |
| WO | WO 00/58665 | 10/2000 |
| WO | WO 02/054502 A1 | 7/2002 |
| WO | WO 02/054503 A1 | 7/2002 |

OTHER PUBLICATIONS

S.H.M., Poort, et al., "Optical properties of Eu2+-activated orthosilicates and orthophosphates", Journal of Alloys and Compounds, vol. 260, No. 1, Sep. 12, 1997, pp. 93-97.

Notification of Reasons for Refusal dated May 16, 2006 (with English translation).

J. Electrochem. Soc.: Solid State Science, 1968, vol. 115, No. 11, pp. 1181-1184.

Korean Office Action dated Jul. 28, 2006 (with English translation).

Fluorescene of Eu2+-Activated Phases in Binary Alkaline Earth Orthosilicate Systems, Solid State Science, Nov. 1968, vol. 115, No. 11, pp. 1181-1184.

Japanese Office Action dated Aug. 1, 2006 (with partial English translation).

* cited by examiner (a)

(b)

LIGHT EMITTING DEVICE

The present Application is a Divisional Application of U.S. patent application Ser. No. 10/451,864 filed on Jun. 30, 2003.

FIELD OF THE INVENTION

The present invention relates to a light emitting device including a light emitting element, and more particularly to, a light emitting device including a light emitting element that emits light in a first spectrum region and a phosphor that is derived from the group of alkaline earth metal orthosilicate or at least contains the phosphor group of alkaline earth metal orthosilicate, and that absorbs part of light emitted from the light emitting element and emits light in another spectrum region.

BACKGROUND OF THE INVENTION

The light emitting device is, for example, an inorganic LED, an organic LED, a laser diode, an inorganic thick film electroluminescence sheet, or an inorganic thin film electroluminescence unit.

In particular, the LED is outstanding for the characteristics of a long life, the absence of necessity of a wide space, the strength against the impact, and further for the light emission in a narrow spectrum band.

The inherent light emission from an active semiconductor material of LED does not offer sufficiently a number of emission light colors, in particular, a number of emission light colors with a wide spectrum band. This is true of, in particular, the case that white color light emission is targeted.

From the state of the art, even an emission light color unavailable originally by semiconductors can be obtained by a color conversion technique.

The color conversion technique is essentially based on the following principle: that is, at least one phosphor is disposed on an LED die; the phosphor absorbs the light emission from the die; and then it emits photoluminescence light in another light emission color.

To compose the phosphor, basically, an organic material is available and an inorganic material is also available. The essential advantage of inorganic pigment is that it has a higher environment resistance than an organic based phosphor. In consideration of the color stability based on the long life of inorganic LED, the inorganic material is more advantageous.

In consideration of the processing easiness, it is apparently advantageous to use an inorganic fluorescent pigment instead of an organic fluorescent coat based phosphor that requires an excessively long growth period to obtain a necessary film thickness. The pigment is added into the matrix, and then placed on the LED die.

From the reason that the number of inorganic materials satisfying the above-mentioned demands is small, YAG group materials are, at present, used as the pigment for the color conversion in most cases. However, the YAG group materials have a disadvantage that they show a high efficiency only when the light emission maximum value is less than 560 nm. Because of this, when using a YAG pigment in combination with a blue diode (450 nm and 490 nm), only a white emission light color with a cold feeling can be realized. Especially, in the field of lighting, there is a higher demand concerning the color temperature and the color reproduction. This demand cannot be satisfied by white LED's available now.

The International publication No. WO 00/33389 discloses that $Ba_2SiO_4:Eu^{2+}$ can be used as the phosphor to get light close to white in using a blue LED. The emitted light of $Ba_2SiO_4:Eu^{2+}$ has a relatively short wavelength of 505 nm, and therefore, the light is remarkably in cold color.

S. H. M. Poort et al., "Optical properties of $Eu^{2+}$-activated" page 297 reports the properties of $Ba_2SiO_4$ and a phosphate such as $KBaPO_4$ and $KSrPO_4$ that are activated by $Eu^{2+}$. In this report, it is confirmed that the light emission of $Ba_2SiO_4$ is at 505 nm. Furthermore, it is reported that the light emission of the two phosphates are essentially at a further shorter wavelength (420 nm to 430 nm)

SUMMARY OF THE INVENTION

It is an object of the present invention is to provide a light emitting device that can offer different light colors or a high color reproducibility by the high photoluminescence effect through the remarkably good absorption of ultraviolet ray or blue ray emitted from a first light source by a phosphor. In this case, it is particularly advantageous that the position of the color in the CIE-deviation ellipse commonly used for a light source for ordinary lighting is in the extremely approximate color temperature range between about 2600 K and 7000 K.

According to the present invention, the light emitting device comprises a light emitting diode which is made of a nitride semiconductor and a phosphor which absorbs a part of lights emitted from the light emitting diode and emits different lights with wavelengths other than those of the absorbed lights. The phosphor is made of alkaline earth metal silicate fluorescent material activated with europium.

The phosphor may be an alkaline earth metal orthosilicate activated by a divalent europium represented by the formula:

(2-x-y)SrO.x(Ba, Ca)O.(1-a-b-c-d)$SiO_2$.a$P_2O_5$ 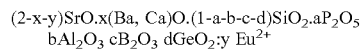 :y $Eu^{2+}$ (wherein 0<x <1.6, 0.005<y<0.5, and 0<a, b, c, d<0.5) and/or an alkaline earth metal orthosilicate represented by (2-x-y)BaO.x(Sr, Ca)O.(1-a-b-c-d)$SiO_2$.a$P_2O_5$ b$Al_2O_3$ c$B_2O_3$ d$GeO_2$:y $Eu^{2+}$ (wherein 0.01<x<1.6, 0.005<y<0.5, and 0<a, b, c, d<0.5), wherein at least one of the a, b, c, and d values is larger than 0.01 advantageously.

That is, it was found out unexpectedly that the wavelength of the irradiated light is prolonged in the case a strontium silicate or a mixture of a barium silicate and a strontium orthosilicate is used instead of a barium silicate. Substitution of silicon by germanium, and additionally existing $P_2O_3$, $Al_2O_3$ and/or $B_2O_3$ influence on the light emission spectrum. As a result, the light emission spectrum can be adjusted optimally in each case of use.

The light emitting device has, advantageously, another phosphor from the group of an alkaline earth metal aluminate activated by divalent europium and/or manganese, and/or Y (V, P, Si)$O_4$:Eu or, a further different phosphor for emitting a red light from the group of an alkaline earth metal-magnesium-disilicate: $Eu^{2+}$, $Mn^{2+}$ represented by the formula:

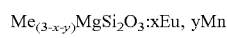

(wherein 0.005<x<0.5, 0.005<y<0.5, and Me denotes Ba and/or Sr and/or Ca).

Furthermore, it was found out that including a small amount of monovalent ion, in particular, a halide into a phosphor matrix is advantageous to enhance the crystallization degree and the irradiation ratio.

It is advantageous that the first spectrum region is 300 to 500 nm. In this wavelength region, the phosphor of the present invention can be well excited.

Moreover, it is advantageous that the second spectrum region is 430 nm to 650 nm. In this case, a relatively pure white color can be further obtained.

The light emitting device advantageously emits white light with an Ra value >72.

BRIEF DESCRIPTION OF DRAWINGS

FIG. 3 shows the structure of a planar light source device in a third preferred embodiment according to the invention, wherein FIG. 3(a) is a plan view and FIG. 3(b) is a sectional view cut along the line A—A in FIG. 3(a);

PREFERRED EMBODIMENTS OF THE INVENTION

Figure 1:
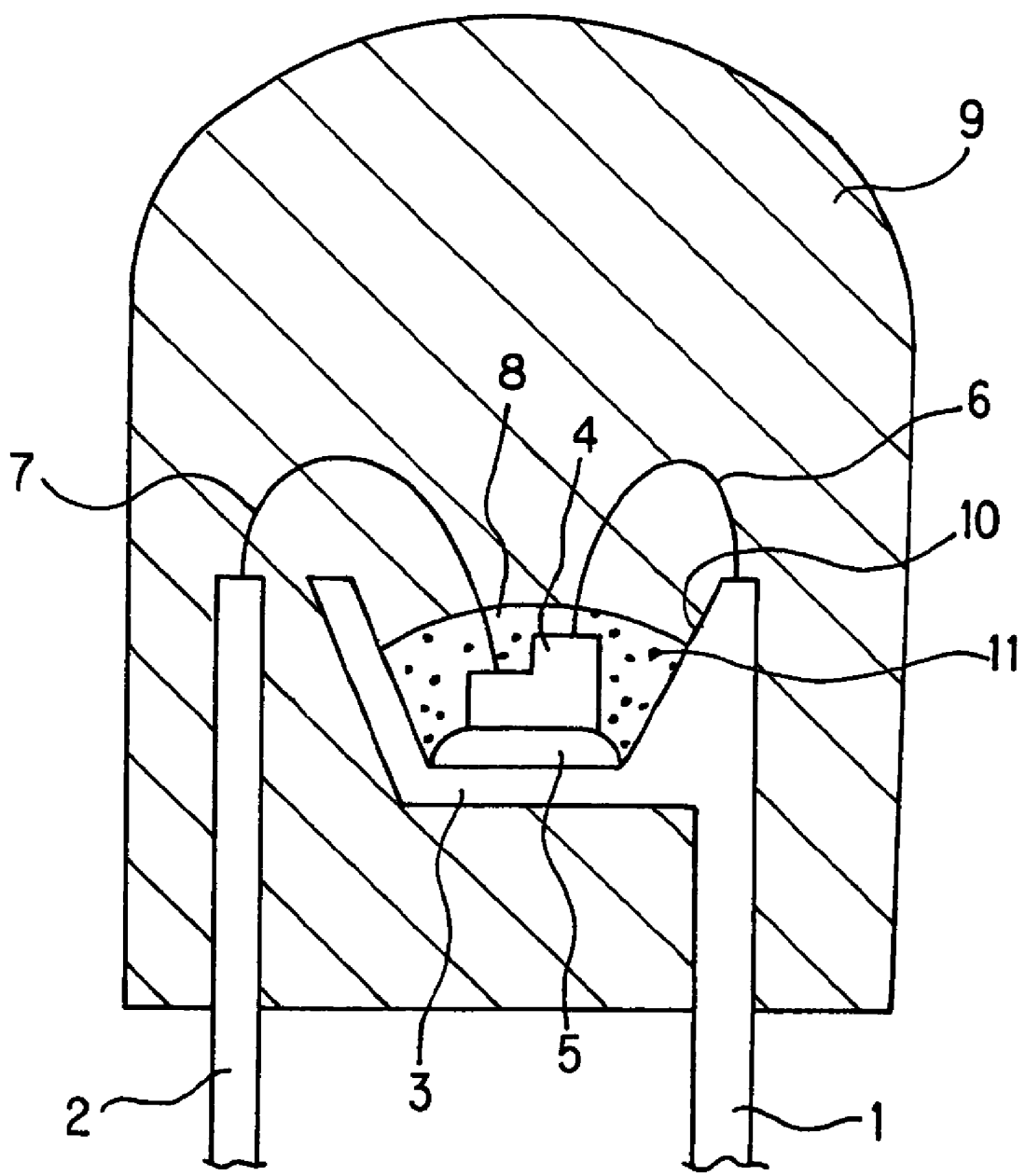
FIG. 1 is a cross-sectional view showing an LED lamp in a second preferred embodiment according to the invention.

In a first preferred embodiment according to the present invention, a light emitting device comprises two different phosphors, and in this case, at least one of the phosphors is an alkaline earth metal orthosilicate phosphor. Thereby, the white tone can be particularly adjusted to be accurate.

In the structural modifications of a light emitting device according to the present invention, there exist many possibilities. According to a preferred embodiment, one or more LED chips are disposed on a substrate in a reflection mirror and the phosphor is dispersed in a lens disposed on the reflection mirror.

However, it is also possible that one or more LED chips are disposed on a substrate in a reflection mirror and the phosphor is coated on the reflection mirror.

The LED chips are advantageously filled with a transparent sealing compound with a dome-like shape. The sealing compound provides the mechanical protection on one hand, and the sealing compound further improves the optical property on the other hand (improved light emission of the LED die).

The phosphor may be dispersed in the sealing compound. By the sealing compound, the LED chips disposed on the substrate and a polymer lens are bonded without containing a gas as much as possible. In this case, the polymer lens and the sealing compound have a refraction index difference of 0.1 at the maximum. The LED die can be sealed directly by the sealing compound. However, it is also possible that the LED die is sealed with a transparent sealing compound (i.e., in this case, there are the transparent sealing compound and the sealing compound to contain the phosphor). Owing to the refraction indices close to each other, there is little loss of reflection at the interface.

The polymer lens advantageously has a spherical or oval dent. The dent is filled with the sealing compound. As a result, the LED array is fixed at a short distance from the polymer lens. Thereby, the mechanical structure size can be reduced.

To achieve a homogeneous distribution of the phosphor, it is advantageous that the phosphor is suspended advantageously in an inorganic matrix.

In the case that two phosphors are used, it is advantageous that the two phosphors are suspended in each matrix, and, in that case, these matrices are disposed back and forth in the light propagation direction. Thereby, the matrix concentration can be reduced compared with the case that the different phosphors are dispersed mixed together.

Next, an important step in the process of making a phosphor in the first preferred embodiment according to the present invention will be explained.

In producing a silicate phosphor, according to a selected composition ratio, alkaline earth metal carbonate, silica dioxide, and europium oxide are mixed thoroughly with each stoichiometric amount as the starting substances, and, using a conventional solid reaction used to produce a phosphor, it is converted to a desired phosphor at 1,100° C. and 1,400° C. temperature in reducing atmosphere. In this regard, it is advantageous to add ammonium chloride or another halide of a small ratio to the reaction mixture, preferably less than 0.2 mole thereto, to enhance the crystallization degree. If required, part of the silicon may be substituted by germanium, boron, aluminum or phosphorus, or part of the europium may be substituted by manganese. This can be carried out by adding a compound of above-mentioned respective elements, which will be decomposed by heating, by a corresponding amount. In this case, the reaction condition range is maintained.

The obtained silicate emits light at a wavelength of 510 nm to 600 nm, and it has a half bandwidth up to 110 nm.

By using one selected from the above-mentioned group of the phosphors or a combination of phosphors selected from the above-mentioned group, or a combination of a phosphor of alkaline earth metal aluminate activated by divalent europium and/or manganese, a further different phosphor to emit a red light selected from the group of Y (V, P, Si)$O_4$: $Eu^{2+}$, and a conventional phosphor selected from the group of $Y_2O_2S:Eu^{3+}$, an emission light color with defined color temperature and a higher color reproducibility can be obtained. This is as shown by the following examples.

$T$=2778K (464 nm+$Sr_{1.4}Ba_{0.6}SiO_4$: $Eu^{2+}$); $x$=0.4619, $y$=0.4247, Ra=72, $T$=2950K (464 nm+$Sr_{1.4}Ba_{0.6}SiO_4$: $Eu^{2+}$); $x$=0.4380, $y$=0.4004, Ra=73, $T$=3497K (464 nm+$Sr_{1.6}Ba_{0.4}SiO_4$: $Eu^{2+}$); $x$=0.4086, $y$=0.3996, Ra=74, $T$=4183K (464 nm+$Sr_{1.9}Ba_{0.08}Ca_{0.02}SiO_4$: $Eu^{2+}$); $x$=0.3762, $y$=0.3873, Ra=75, $T$=6624K (464 nm+$Sr_{1.9}Ba_{0.02}Ca_{0.08}SiO_4$: $Eu^{2+}$); $x$=0.3101, $y$=0.3306, Ra=76, $T=6385K$ (464 nm+$Sr_{1.6}Ba_{0.4}SiO_4$: $Eu^{2+}$+
$Sr_{0.4}Ba_{1.6}SiO_4$: $Eu^{2+}$); $x=0.3135$, $y=0.3397$,
Ra=82, $T=4216K$ (464 nm+$Sr_{1.9}Ba_{0.08}Ca_{0.02}SiO_4$: $Eu_{2+}$);
$x=0.3710$, $y=0.3696$, Ra=82, 3954K (464 nm+$Sr_{1.6}Ba_{0.4}SiO_4$: $Eu^{2+}$+
$Sr_{0.4}Ba_{1.6}SiO_4$: $Eu^{2+}$+$YVO_4$: $Eu^{3+}$); $x=0.3756$,
$y=0.3816$, Ra=84, $T=6489K$ (464 nm+$Sr_{1.6}Ba_{0.4}SiO_4$: $Eu^{2+}$+
$Sr_{0.4}Ba_{1.6}SiO_4$: $Eu^{2+}$+barium magnesium aluminate: $Eu^{2+}$); $x=0.3115$, $y=0.3390$, Ra=66, $T=5097K$ (464 nm+$Sr_{1.6}Ba_{0.4}(Si_{0.08}B_{0.02})O_4$: $Eu^{2+}$+
$Sr_{0.6}Ba_{1.4}SiO_4$: $Eu^{2+}$); $x=0.3423$, $y=0.3485$,
Ra=82, $T=5084K$ (464 nm+$Sr_{1.6}Ba_{0.4}(Si_{0.08}B_{0.02})O_4$: $Eu^{2+}$+
$Sr_{0.6}Ba_{1.4}SiO_4$: $Eu^{2+}$+strontium magnesium aluminate: $Eu^{2+}$); $x=0.3430$, $y=0.3531$, Ra=83, $T=3369K$ (464 nm+$Sr_{1.4}Ba_{0.6}Si_{0.95}Ge_{0.05}O_4$: $Eu^{2+}$);
$x=0.4134$, $y=0.3959$, Ra=74, $T=2787K$ (466 nm+$Sr_{1.4}Ba_{0.6}Si_{0.98}P_{0.02}O_{4.01}$: $Eu^{2+}$);
$x=0.4630$, $y=0.4280$, Ra=72, $T=2913K$ (464 nm+$Sr_{1.4}Ba_{0.6}Si_{0.98}Al_{0.02}O_4$: $Eu^{2+}$);
$x=0.4425$, $y=0.4050$, Ra=73.

In one advantageous embodiment according to the present invention, the color conversion may be performed as below.

One or more LED chips are assembled on a substrate. Directly on the substrate, a sealing material is disposed formed semispherically or a semielliptically (for the purpose of protecting the LED chip protection on one hand, and for the purpose of well and for emitting preferable discharge of the light generated in the LED chips on the other hand). The sealing material may separately seal each die, or it may be commonly formed for all the LED's. The substrate thus fabricated is disposed in a reflection mirror or the reflection mirror is placed on the LED chips.

A lens is installed on the reflection mirror. On one hand, the lens is used for protecting the device, and on the other hand, a fluorescent pigment is mixed in the lens. Thereby, the lens gives an impression of an opaque and yellow color. Blue light (including ultraviolet ray) passed through the lens is converted to a longer wavelength light (yellow light) when passing through the optical parts. As a result, a white color impression can further be obtained by mixing the blue light and converted light (yellow light). For example, the loss by the waveguide effect generated between flat and parallel plates can be reduced by the opaqueness and the dispersion property of the lens. Further, by the reflection mirror, only the preliminarily adjusted light is controlled to be entered into the lens. As a result, the total reflection effect can be reduced from the beginning.

Alternatively, the reflection mirror may be placed on each LED chip, and the reflection mirror is filled in a dome-like shape, and further, the lens is disposed above each reflection mirror or above the entire device.

It is advantageous to use an LED array instead of a single LED in the production of the light emitting device for illumination. In another advantageous embodiment of the present invention, the color conversion may be executed by the LED array with the LED chips assembled directly on a substrate as follows.

Using a sealing compound (such as an epoxy resin), an LED array is bonded with a transparent polymer lens made from another material (such as a PMMA). The materials of the polymer lens and the sealing compound are selected so as to have refraction indices as close as possible, that is, with the phase matching. The sealing compound exists in the maximum spherical or elliptic dent of the polymer lens. The shape of the dent is important in the point that the cover conversion substance is dispersed in the sealing compound. Therefore, according to the shape, obtainment of the light emission color regardless of the angle can be ensured. In addition, the above-mentioned array can be filled with a transparent sealing compound, and further, it can be bonded with the above-mentioned polymer lens using the sealing compound containing the color conversion substance.

For an LED having a particularly preferable color reproductivity using at least two different phosphors, it is advantageous to disperse the phosphors separately, and superimpose the same instead of dispersing the phosphors together in one matrix. This is applied in particular to a combination for obtaining the final light emission color by a plurality of color conversion processes. That is, the light emission color with the longest wavelength is produced by one light emission process. In this case, the light emission process is carried out as follows: that is, absorption of the LED light emission by a first phosphor, light emission by the first phosphor, absorption of the light emission of the first phosphor by a second phosphor, and the light emission by the second phosphor. In particular, for this kind of the process, it is advantageous to dispose the phosphors back and force in the light propagation direction because the concentration of the phosphors can be reduced thereby compared with the case of simply dispersing various phosphors.

The present invention is not limited to the above-mentioned embodiments. The phosphors may be assembled in a polymer lens (or another optical part). The phosphors may be disposed directly on the LED die, or it maybe disposed on the surface of the transparent sealing compound. Moreover, the phosphors may be assembled in a matrix together with dispersed particles. Thereby, precipitation in the matrix can be prevented and homogeneous light emission can be ensured.

The above-described example of the use of a phosphor having photoluminescence effect in a light emitting diode (LED) lamp will be explained in more detail.

FIG. 1 is a typical cross-sectional view of an LED lamp according to a second embodiment of the light emitting device according to the invention. The LED lamp shown in FIG. 1 is the so-called "lens-type LED lamp." A blue LED 4 formed of a GaN semiconductor is mounted through a mount 5 on a metal stem 3 that forms a cup 10 which functions as a reflection mirror for reflecting, above the LED lamp, light emitted from the blue LED 4. One electrode of the blue LED 4 is connected to a lead frame 2 through a gold bonding wire 7, and the other electrode is connected to a lead frame 1 through a gold bonding wire 6. The inside of the cup 10 is filled with an internal resin 8 as a coating member to fix the blue LED 4. Further, the lead frame 2 and the lead frame 1 provided with the metal stem 3 are covered with an external resin 9 as a mold member. Therefore, the blue LED 4 is double covered with the internal resin 8 and the external resin 9. The metal stem 3 and the lead frame 1 are also referred to as a mount lead. The blue LED 4 will be explained below in more detail.

The internal resin 8 containing a phosphor 11 is filled into the cup 10 to a level below the level surface of the upper edge of the cup 10. When a plurality of LEDs are disposed close to each other in this way, this construction can prevent mixing of colors between LEDs and can realize a flat display using LEDs to produce images with high resolution.

Regarding the internal resin 8, a silicone resin or an epoxy resin is used which becomes transparent upon curing. The internal resin 8 contains a phosphor 11 composed mainly of the divalent europium-activated alkaline earth metal orthosilicate and/or an alkaline earth metal orthosilicate. As described above, the phosphor 11 has photoluminescence effect. Specifically, the phosphor 11 absorbs light emitted from the blue LED 4 and emits light with a wavelength different from the wavelength of the absorbed light.

Instead of the silicone resin or the epoxy resin, low melting glass may be used as the internal resin 8. The low melting glass has excellent moisture resistance and, at the same time, can prevent the entry of harmful ions into the blue LED 4. Further, light emitted from the blue LED 4 as such can be passed through the low melting glass without absorption into the glass. Therefore, there is no need to emit light with higher intensity in expectation of light absorption.

Further, a scattering material may be incorporated into the silicone resin or epoxy resin as the internal resin 8 with the phosphor 11 incorporated therein or the low melting glass with the phosphor 11 incorporated therein. The scattering material irregularly reflects light emitted from the blue LED 4 to produce scattered light. Therefore, light from the blue LED 4 is more likely to apply to the phosphor 11, whereby the quantity of light emitted from the phosphor 11 can be increased. The scattering material is not particularly limited, and any well known material may be used.

Regarding the external resin 9, an epoxy resin may be used which becomes transparent upon curing.

Various resins, such as epoxy resin, may be used in the mount 5 from the viewpoint of good handleability. Preferably, the resin used in the mount 5 has adhesive properties and, in addition, has insulating properties from the viewpoint of avoiding, even when the mount 5 is pushed out toward the side face of the very small blue LED 4, a short circuit between the layers at the side face.

The mount 5 is formed of a transparent resin so that light emitted isotropically from the blue LED 4 can be passed through the transparent resin, reflected from the reflection mirror on the surface of the cup 10, and emitted above the LED lamp. In particular, when the LED lamp is used as a white light source, the color of the mount 5 may be white which does not hinder white light.

The mount 5 may contain a phosphor 11. In the case of the LED lamp using the phosphor 11, the optical density is much higher than that in the case of an LED lamp not using the phosphor 11. Specifically, since light emitted from the blue LED 4 does not pass through the phosphor 11, the light emitted from the blue LED 4 is reflected from the phosphor 11 provided near the blue LED 4, is newly isotropically emitted as light excited by the phosphor 11, is also reflected from the reflection mirror on the surface of the cup 10, and is further reflected due to a difference in refractive index between the individual sections of the LED lamp. Therefore, light is partially densely confined in a portion near the blue LED 4 to render the optical density near the blue LED 4 very high, contributing to emission of light with high luminance from the LED lamp.

The blue LED 4 isotropically emits light, and the emitted light is also reflected from the surface of the cup 10. These lights are passed through the mount 5, and, thus, the optical density within the mount 5 is very high. Accordingly, the incorporation of the phosphor 11 into the mount 5 permits these lights emitted from the blue LED 4 to be reflected from the phosphor 11 contained in the mount 5 and to be newly isotropically emitted as light excited by the phosphor 11 contained in the mount 5. Thus, the incorporation of the phosphor 11 also into the mount 5 can further enhance the luminance of light emitted from the LED lamp.

Further, the mount 5 may be formed of a resin containing an inorganic material such as silver. Since a resin, such as epoxy resin, is used in the mount 5 and the internal resin 8, when the high-luminance LED lamp is used for a long period of time, the internal resin 8 or the mount 5, formed of a synthetic resin, in its portion very close to the blue LED 4 is brown or black colored and deteriorated, leading to lowered emission efficiency. In particular, the coloration of the mount 5 in its portion close to the blue LED 4 significantly lowers the emission efficiency. Not only resistance to light (weathering resistance) emitted from the blue LED 4 but also adhesion, intimate contact and the like are required of the mount 5. The problem of the deterioration in resin caused by light can be solved by using a resin containing an inorganic material, such as silver, in the mount 5. The mount 5, which can meet these property requirements, can be simply formed by mixing a silver paste and a phosphor 11 with a mount paste, coating the mixture on the metal stem 3 by means of mount equipment and then bonding the blue LED 4 to the coating.

The mount 5 may be formed of, in addition to a silver-containing epoxy resin, a silicone resin as an inorganic material-containing organic resin. The inorganic material contained in the mount 5 should be brought into intimate contact with the resin, i.e., should have good adhesion to the resin and, at the same time, should not be deteriorated by light emitted from the blue LED 4. To meet these requirements, at least one inorganic material is selected from silver, gold, aluminum, copper, alumina, silica, titanium oxide, boron nitride, tin oxide, zinc oxide, and ITO, and is incorporated into the resin. In particular, silver, gold, aluminum, copper and the like can improve heat radiation and is electrically conductive and thus can be applied to semiconductor devices expected to have electrical conductivity. Alumina, silica, titanium oxide, boron nitride and the like have high weathering resistance and permits the mount 5 to maintain high reflectance. The inorganic material may be in various forms, for example, spherical, acicular, or flaky form, which may be determined by taking into consideration, for example, dispersibility and electrical conductivity. In the mount 5, the heat radiation, the electrical conductivity and the like maybe regulated to respective various levels by varying the content of the inorganic material in the resin. Since, however, increasing the content of the inorganic material in the resin causes no significant deterioration in resin but deteriorates the adhesion, the inorganic material content is not less than 5% by weight and not more than 80% by weight. An inorganic material content of not less than 60% by weight and not more than 80% by weight is better suited for the prevention of the deterioration of the resin.

In this way, the incorporation of an inorganic material, such as silver, which is less likely to be deteriorated upon exposure to the emitted light, into the blue LED 4, can suppress a deterioration in the resin in the mount 5 by the light. Therefore, the incorporation of an inorganic material can reduce colored sites caused by the deterioration, can prevent a lowering in emission efficiency, and can provide good adhesion (intimate contact). The incorporation of the phosphor 11 also into the mount 5 can further enhance the luminance of the LED lamp.

This can realize the provision of an LED lamp which can emit light with high luminance and causes only a very low lowering in emission efficiency even after use with high luminance for a long period of time. Further, the use of a material having high heat conductivity can stabilize the characteristics of the blue LED 4 and can reduce irregular color.

Figure 2:
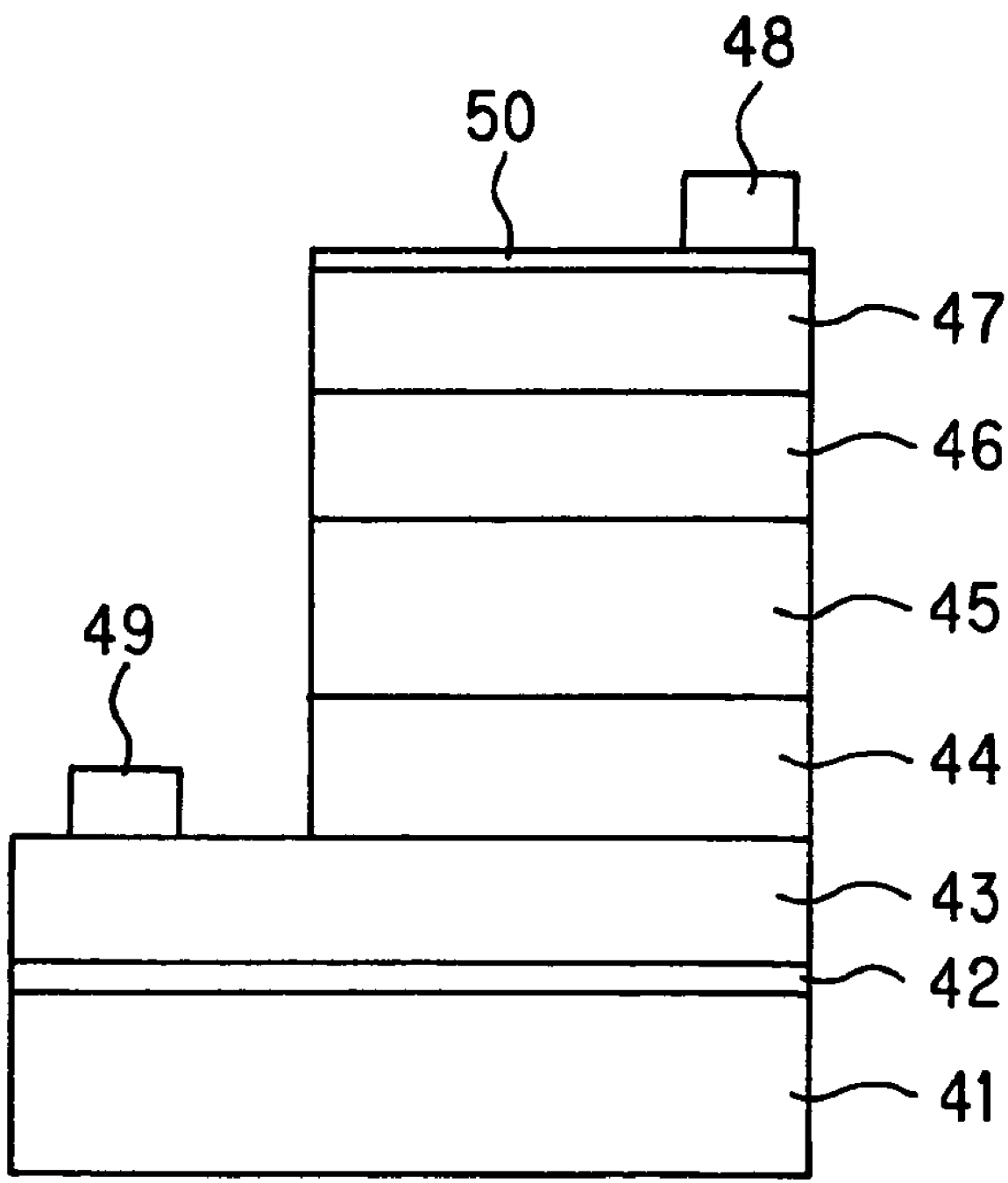
FIG. 2 is a cross-sectional view showing a layer structure of the blue LED in FIG. 1.

FIG. 2 shows the layer structure of the blue LED 4 of the LED lamp shown in FIG. 1. The blue LED 4 comprises a transparent substrate, for example, a sapphire substrate 41. For example, a buffer layer 42, an n-type contact layer 43, an n-type cladding layer 44, an MQW (multi-quantum well) active layer 45, a p-type cladding layer 46, and a p-type contact layer 47 are formed in that order as nitride semiconductor layers, for example, by MOCVD, on the sapphire substrate 41. Thereafter, a light-transparent electrode 50 is formed on the whole surface of the p-type contact layer 47, a pelectrode 48 is formed on a part of the light-transparent electrode 50, and an n electrode 49 is formed on a part of the n-type contact layer 43. These layers may be formed, for example, by sputtering or vacuum deposition.

The buffer layer 42 may be formed of, for example, AlN, and the n-type contact layer 43 may be formed of, for example, GaN.

The n-type cladding layer 44 may be formed of, for example, $Al_yGa_{1-y}N$ wherein $0 \leq y < 1$, the p-type cladding layer 46 may be formed of, for example, $Al_xGa_{1-x}N$ wherein $0 < x < 1$, and the p-type contact layer 47 may be formed of, for example, $Al_zGa_{1-z}N$ wherein $0 \leq z < 1$ and $z < x$. The band gap of the p-type cladding layer 46 is made larger than the band gap of the n-type cladding layer 44. The n-type cladding layer 44 and the p-type cladding layer 46 each may have a single-composition construction, or alternatively may have a construction such that the above-described nitride semiconductor layers having a thickness of not more than 100 angstroms and different from each other in composition are stacked on top of each other so as to provide a super lattice structure. When the layer thickness is not more than 100 angstroms, the, occurrence of cracks or crystal defects in the layer can be prevented.

The MQW active layer 45 is composed of a plurality of InGaN well layers and a plurality of GaN barrier layers. The well layer and the barrier layer have a thickness of not more than 100 angstroms, preferably 60 to 70 angstroms, so as to constitute a superlattice structure. Since the crystal of InGaN is softer than other aluminum-containing nitride semiconductors, such as AlGaN, the use of InGaN in the layer constituting the active layer 45 can offer an advantage that all the stacked nitride semiconductor layers are less likely to be cracked. The MQW active-layer 45 may also be composed of a plurality of InGaN well layers and a plurality of AlGaN barrier layers. Alternatively, the MQW active layer 45 may be composed of a plurality of AlInGaN well layers and a plurality of AlInGaN barrier layers. In this case, the band gap energy of the barrier layer is made larger than the band gap energy of the well layer.

A reflecting layer may be provided on the sapphire substrate 41 side from the MQW active layer 45, for example, on the buffer layer 42 side of the n-type contact layer 43. The reflecting layer may also be provided on the surface of the sapphire substrate 41 remote from the MQW active layer 45 stacked on the sapphire substrate 41. The reflecting layer preferably has a maximum reflectance with respect to light emitted from the active layer 45 and may be formed of, for example, aluminum, or may have a multi-layer structure of thin GaN layers. The provision of the reflecting layer permits light emitted from the active layer 45 to be reflected from the reflecting layer, can reduce the internal absorption of light emitted from the active layer 45, can increase the quantity of light output toward above, and can reduce the incidence of light on the mount 5 to prevent a deterioration in the mount 5 caused by the light.

The half value width of the light-emitting wavelength of the blue LED 4 having the above construction is not more than 50 nm, preferably not more than 40 nm. The peak light-emitting wavelength of the blue LED 4 is in the range of 380 nm to 500 nm, for example, is 450 nm.

In the LED lamp having the above construction, upon the application of a voltage across the lead frames 1, 2, the blue LED 4 emits blue light with a wavelength of 450 nm. The blue light excites the phosphor 11 contained in the internal resin 8, and the excited phosphor 11 emits yellow light with a wavelength of 560 to 570 nm. The mixed light, composed of blue light and yellow light, in the internal resin 8 is passed through the external resin 9, and is leaked to the exterior. In this case, the mixed light is seen white to the naked eye of the human being, and, consequently, the LED lamp is seen as if the LED lamp emits white light. Specifically, the phosphor 11 is excited by blue light emitted from the blue LED 4 and emits light of yellow which has a complementary color relationship with blue and has a longer wavelength than blue. According to the invention, a more nearly pure white color can be produced through a combination of a plurality of phosphors.

Figure 3:
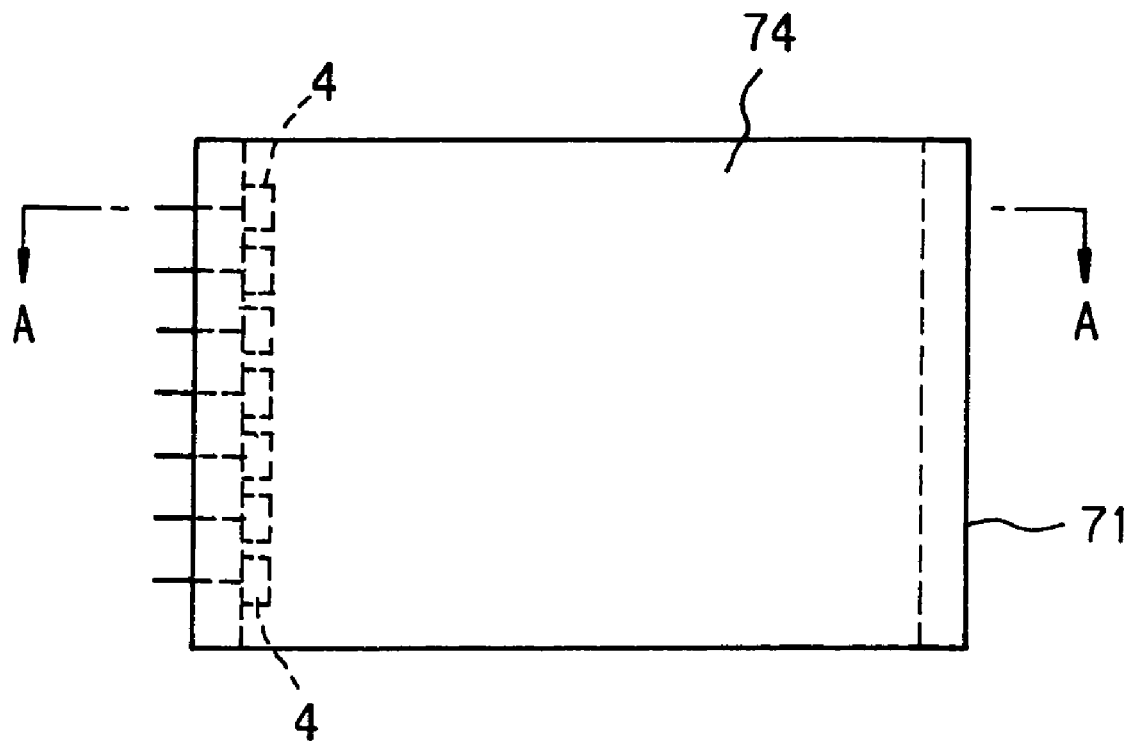
Figure 3:
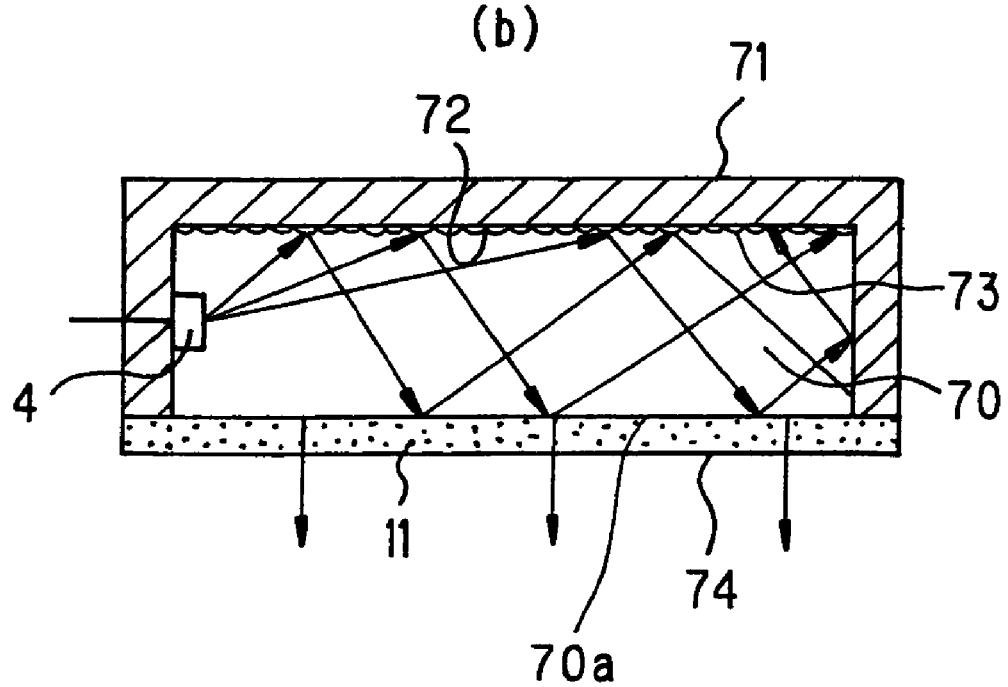

FIG. 3 shows a structure of a planar light-source device involving a third preferred embodiment of the light-emitting device according to the present invention, wherein FIG. 3(a) is a plan view thereof and FIG. 3(b) is a cross-sectional view cut along the line A—A of FIG. 3(a).

The planar light-source device shown in FIG. 3 is applied, for example, to the backlight device of a liquid crystal panel. By illuminating the liquid crystal panel from the backside thereof to render brightness or contrast to a character or an image on the liquid crystal panel not having a light-emitting property, it enhances the visibility of the character or the image. The planar light-source device is provided with and composed of the following elements.

That is, the planar light-source device comprises a transparent and substantially rectangular optical guide plate 70, a plurality of blue LEDs 4 that are optically connected with the optical guide plate 70 by being arranged in an array and buried in a side of the optical guide plate 70, a light reflecting case 71 for reflecting light which surrounds other faces than a light-emitting face 70a of the optical guide plate 70 and fixed to the optical guide plate 70, a light scattering pattern 73 comprising systematic and fine convex-concave patterns formed on a light reflecting face 72 opposing to the light-emitting face 70a of the optical guide plate 70, a transparent film 74 being fixed to the optical guide plate 70 such that the light-emitting face 70a is covered, and containing a phosphor 11 inside thereof.

Further, each of the blue LEDs 4 is fixed to the light reflecting case 71 such that driving voltage of a predetermined voltage is supplied via a power supplying means such as a bonding wire and a lead frame from a power source. The light scattering pattern 73 is provided to scatter the light emitted from the blue LEDs 4 in the inside of the optical guide plate 70.

In the planar light-source device composed like this, when driving voltage is applied to each blue LED 4, light is emitted from each blue LED 4, which was driven. The light emitted travels within the optical guide plate 70 towards a predetermined direction and collides with the light scattering pattern 73 formed on the light reflecting face 72, whereby being reflected and scattered, the light is emitted from the emitting-face 70a through the film 74 as planar emitting-light. Part of the light emitted from the blue LEDs 4, when it passes through the film 74, is absorbed by the phosphor 11, and simultaneously with this, the wavelength conversion thereof is performed to be emitted. This results in that a color of the emitted light, which is observed from the front of the film 74, becomes a resultant color mixed with such light, for example, white as the above-mentioned principle. Like this, according to the planar light-source device of the third preferred embodiment, the light emitted from the blue LEDs 4 is inputted into the optical guide plate 70, then the inputted light, while being reflected to scatter by the light scattering pattern 73 formed on the reflecting face 72 of the optical guide plate 70, is emitted from the emitting face 70a to the film 74, and in the film 74, the light is partly absorbed by the phosphor 11, and at the same time, the conversion of wavelength thereof is performed to be emitted. Therefore, it is possible to make the color of the emitted light white, without using LEDs of each color of red, green and blue as in conventional cases, with blue LEDs 4 only. Moreover, in this structure, since the phosphor 11 and the blue LED 4 do not directly contact to each other, the deterioration of the phosphor 11 can be suppressed for a long period, whereby a predetermined color tone of the planar light source can be held for a long period.

Besides, by changing the kind of the phosphor 11 to be contained in the film 74, it becomes possible to realize a color of the emitted light of not only white but also other colors. If the fixing structure of the film 74 is made a readily removable one, and a plural kinds of films 74 each containing different kind of phosphor 11 from the others are prepared, the color tone of the planar light source can be easily varied by only changing the film 74.

Further, the phosphor 11, besides the method to make it contained in the film 74, may be coated on the film 74, and in this case, also, a similar effect to that in the case of being contained can be obtained.

Furthermore, although the blue LED 4 are optically connected with the optical guide plate 70 by being buried into the optical guide plate 70, besides this, the blue LED 4 and the optical guide plate 70 may be optically connected by adhering the blue LED 4 to the end face of the optical guide plate 70, or by guiding the light emitted from the blue LED 4 to the end face of the optical guide plate 70 with an optical transmission means such as an optical fiber. Moreover, the number of the blue LED 4 to be employed may be made to one.

Figure 4:
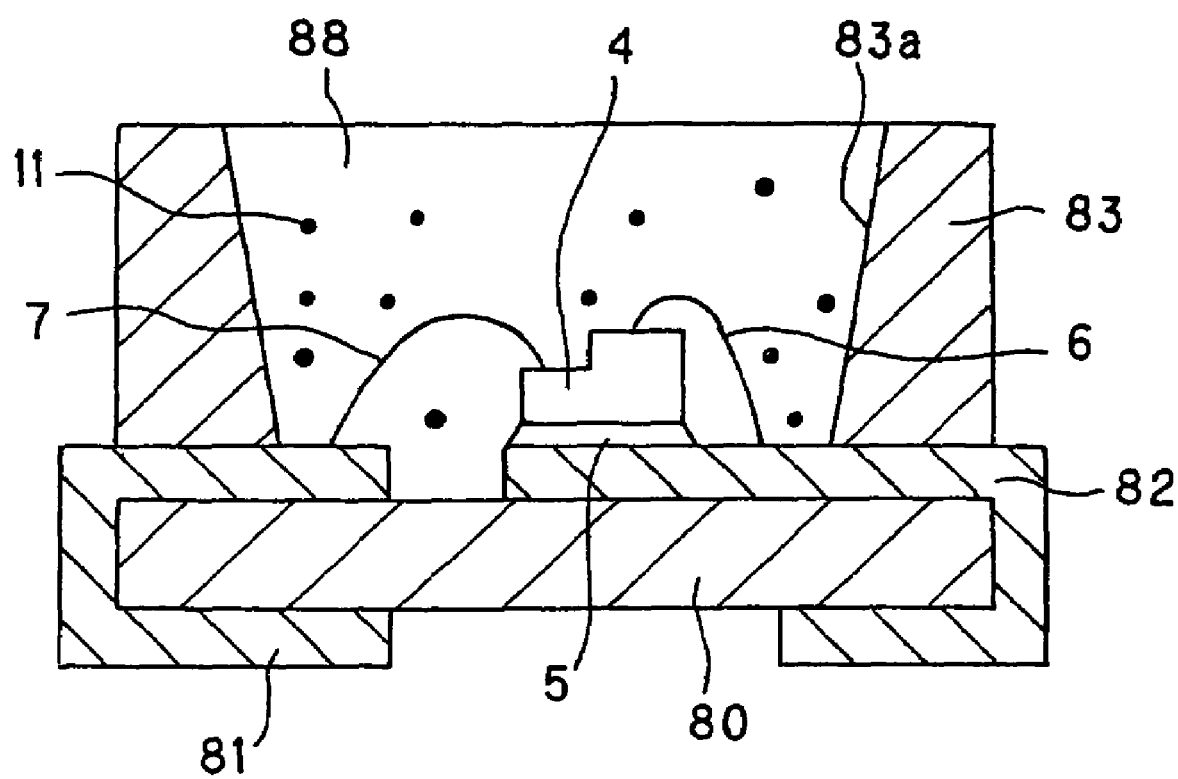
FIG. 4 is a cross-sectional view showing an SMD (Surface Mounted Diode) type LED lamp in a fourth preferred embodiment according to the invention.

FIG. 4 shows an LED lamp of SMD (Surface Mounted Device) type involving a fourth embodiment of the light-emitting device according to the present invention.

The SMD-type LED lamp has a structure as described below. A metal frame is formed by two wiring patterns of gold 81 and 82 covering the both surfaces of a substrate 80 of glass epoxy resin with an insulating property, and being formed to be electrically separated from each other. Over the wiring patterns 81 and 82, a frame 83 having a plastic-made cup 83a is provided. The surface of the cup 83a constitutes a reflection mirror, which reflects light emitted from the blue LED 4. The wiring pattern 81 and 82 are not symmetrical. The upper surface of the wiring pattern 82 is formed as far as the center of the bottom of a space formed by the frame 83, while the other wiring pattern 81 is exposed a little to the bottom of the space formed by the frame 83.

The blue LED 4 is adhered firmly to the upper surface of the wiring pattern 82 with epoxy resin paste containing silver filaments. A p-electrode of the blue LED 4 and the wiring pattern 82 are connected with a bonding wire of gold 6, and an n-electrode of the blue LED 4 and the wiring pattern 81 are connected with a bonding wire of gold 7.

The inside of the space formed by the cup 83a of the frame 83 is filled with a sealing material 88 which becomes transparent after caking thereof. The blue LED 4 is fixed by the sealing material 88. The sealing material 88 contains the phosphor 11 mainly composed of alkaline earth metal orthosilicate activated by bivalent europium and/or alkaline earth metal orthosilicate. The sealing material 88 comprises epoxy resin or silicone resin. The sealing material 88 containing the phosphor 11 may be filled in the whole space formed by the cup 83a of the frame 83, or may be filled up to a position below the upper edge of the frame 83.

Meanwhile, the sealing material 88 containing the phosphor 11 may further contain a scattering material. The scattering material causes irregular reflection of the light emitted from the blue LED 4, which changes the light to scattered light. Consequently, the light from the blue LED 4 becomes easy to strike the phosphor 11, whereby quantity of light to be emitted from the phosphor 11 can be increased. The scattering material is not limited to any particular one, but well-known scattering materials can be used.

In the SMD-type LED lamp composed like this, when a voltage is applied between the wiring patterns 81 and 82, the blue LED 4 emit blue light having a wavelength of 450 nm. The blue light excites the phosphor 11 contained in the sealing material 88, and the excited phosphor 11 emits yellow light of 560 to 570 nm. The mixed light constituted of the blue light and the yellow light in the sealing material 88 comes through the sealing material 88 to the outside thereof, which looks white to human eyes. As a result, the LED lamp looks as if it were emitting white light. That is, the phosphor 11 is excited by the blue light emitted from the blue LEDs 4, and emits yellow light which is in a complementary color relation with blue and having a longer wavelength than that of blue. According to the present invention, by combining a plurality of phosphor, white light which is nearly pure white can be obtained.

Figure 5:
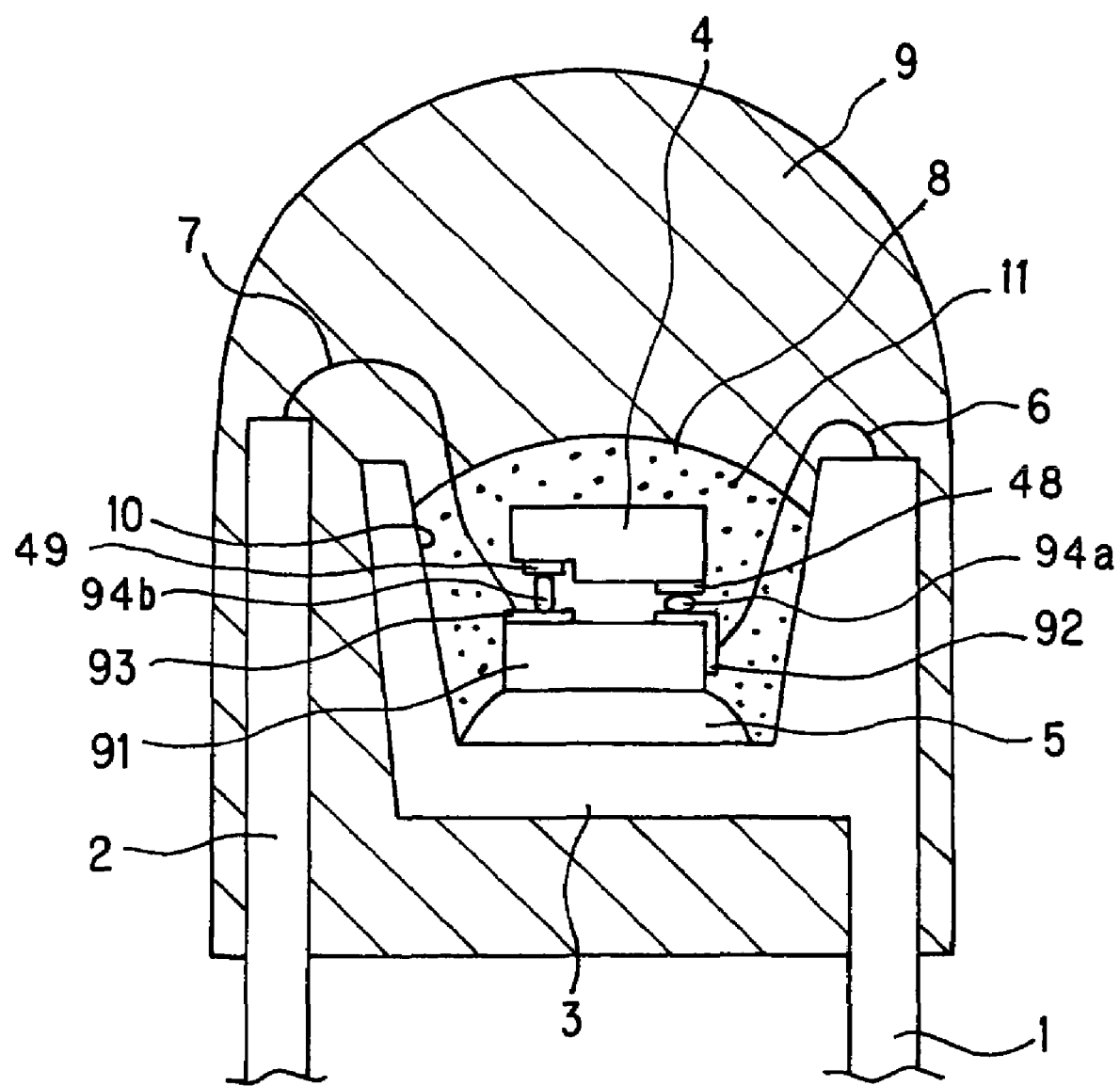
FIG. 5 is a sectional view showing an LED lamp in a fifth preferred embodiment according to the invention.

FIG. 5 is a schematic diagram showing an LED lamp according to a fifth preferred embodiment of a light emitting device of the present invention. In the present embodiment, a blue LED 4 is arranged in such that it can be protected from over voltage of static electricity and the like, and a constitution of which is the one wherein an overvoltage protection element 91 is added to a light source shown in FIG. 1.

As shown in FIG. 5, the overvoltage protection element 91 is fabricated in a chip having a size substantially equal to that of the blue LED 4, and the protection element is located in between the blue LED 4 and a mount 5. In the present embodiment, the blue LED 4 is mounted in the form of flip chip different from the case of FIG. 1 from the reason mentioned later. The overvoltage protection element 91 is provided with electrodes 92 and 93 for connecting with the blue LED 4 and a lead frame 1. The electrode 92 is located at a position opposed to that of the p-electrode 48 shown in FIG. 2, while the electrode 93 is located at a position opposed to that of the n-electrode 49. Furthermore, the electrode 93 is formed so as to extend to a side of the overvoltage protection element 91 in order to be easily connected with a bonding wire 6. The electrodes 92 and 93 on the overvoltage protection element 91 are connected with the p-electrode 48 and the n-electrode 49 of the blue LED 4 through Au bumps 94a and 94b, respectively. The overvoltage protection element 91 may be a Zener diode, which is energized in the case when a voltage more than a specified voltage is applied, or a condenser, which absorbs pulse voltage, and the like components.

Figure 6:
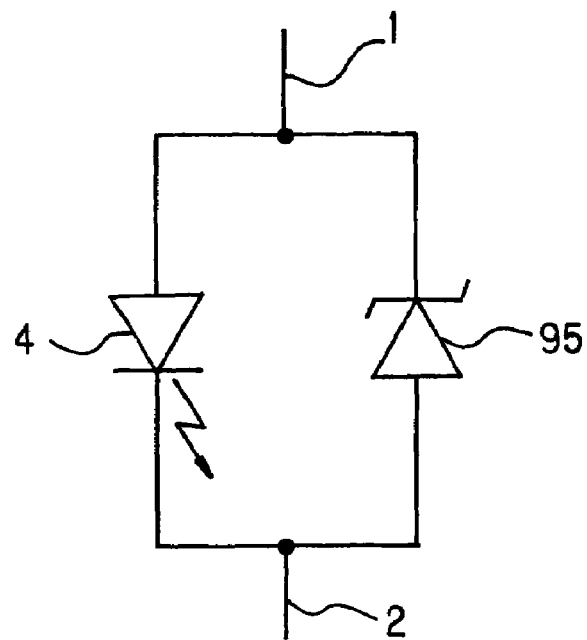
FIG. 6 is a connection circuit diagram showing the case that a Zener diode is used as an overvoltage protection element.

FIG. 6 is a connection circuit diagram showing a case wherein a Zener diode is used for the overvoltage protection element 91. The Zener diode 95 used for the overvoltage protection element 91 is electrically connected in parallel to the blue LED 4 wherein an anode of the blue LED 4 is connected with a cathode of the Zener diode 95, while a cathode of the blue LED 4 is connected with an anode of the Zener diode 95. In the case when an over voltage was applied between a lead frame 1 and a lead frame 2 and if the voltage is over a Zener voltage of the Zener diode 95, a terminal voltage of the blue LED 4 is held by the Zener voltage, so that the former voltage does not over the Zener voltage. Thus, the blue LED 4 can be prevented from application of an over voltage, so that the blue LED 4 is protected from an over voltage, whereby the blue LED 4 can be prevented from occurrence of device breakdown or deterioration in performance thereof.

Figure 7:
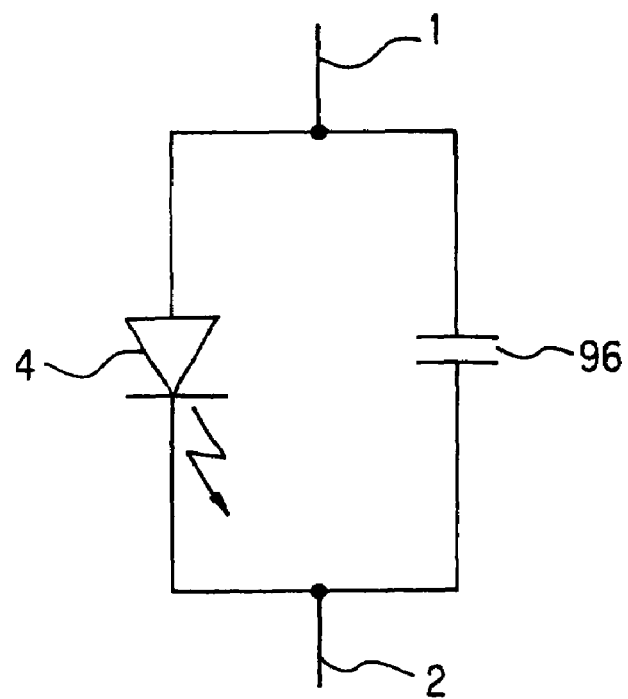
FIG. 7 is a connection circuit diagram showing the case that a capacitor is used as an overvoltage protection element.

FIG. 7 is a connection circuit diagram showing a case wherein a condenser is used for the overvoltage protection element 91. The condenser 96 used for the overvoltage protection element 91 may be a chip type component used for surface mount. The condenser 96 having a structure as described above is provided with belt-like electrodes on the opposite sides thereof, and these electrodes are connected in parallel to an anode and a cathode of the blue LED 4. When an over voltage is applied across a frame lead 1 and a frame lead 2, a charging current flows through the condenser 96 due to the over voltage to drop instantaneously its terminal voltage, whereby an applied voltage does not rise with respect to the blue LED 4. Hence, the blue LED 4 can be prevented from an over voltage.

Furthermore, even when noise containing a high-frequency component was applied, the condenser 96 functions as a bypass condenser, so that exogenous noise can be excluded.

As described above, the blue LED 4 has been mounted in the form of flip chip, which is turned upside down with respect to a posture shown in FIG. 1. The reason of which is in that electrical connections are required for both the overvoltage protection element 91 and the blue LED 4 as a result of providing the overvoltage protection element 91. If each of the blue LED 4 and the overvoltage protection element 91 is connected with the use of a bonding wire, the number of bonding wire increases so that productivity thereof decreases, besides, since cases of contact, disconnection and the like of the bonding wires themselves increase, whereby there is a fear of deterioration in reliability. Thus, the blue LED 4 is mounted in the form of flip chip. More specifically, the bottom of the sapphire substrate 41 shown in FIG. 2 is located at the uppermost position wherein the p-electrode 48 is connected to the electrode 92 of the overvoltage protection element 91 through the Au bump 94a, while the n-electrode 49 is connected to the electrode 93 of the overvoltage protection element 91 through the Au bump 94b. As a result, there is no need of connecting the bonding wires 6 and 7 with the blue LED 4. In the case where the blue LED 4 is mounted in the form of flip chip, the light transparent electrode 50 shown in FIG. 2 may be replaced by a non-light transparent electrode. Moreover, it maybe arranged in such that the n-electrode 49 is thickened so as to have the same height as that of the surface of the p-electrode 48, or a novel conductor is connected to the n-electrode 42, so that it can be used as an electrode.

As described above, according to the constitution shown in FIG. 5, there is an advantage of providing no case where the blue LED 4 is damaged or deteriorated in performance even if an over voltage is applied due to static electricity and the like in addition to a standard advantage as a light source in accordance with the constitution shown in FIG. 1. Furthermore, since the overvoltage protection element 91 functions as a submount, even if the blue LED 4 has been mounted in the form of flip chip, there is no case of lowering a height of bonding positions of the bonding wires 6 and 7 on the side of the chip. Accordingly, bonding can be conducted at a position substantially the same as that of a case of the constitution of FIG. 1.

In the case where a semiconductor device is used for the overvoltage protection element 9 in FIGS. 5 and 6, a general silicon diode may be used in place of the Zener diode. In this case, the number of silicon diodes is decided in accordance with such a manner that polarities of a plurality of silicon diodes are made to be the same with each other, and they are connected in series with each other, so that a value of a total voltage drop in forward direction (about 0.7 V×the number of silicon diodes) becomes equal to operating voltage with respect to over voltage.

Moreover, a variable register may also be used for the overvoltage protection element 91. The variable register has such a characteristic that its resistance value decreases with increase of an applied voltage, whereby the variable resistor can suppress an over voltage as in the case of the Zener diode 95.

Figure 8:
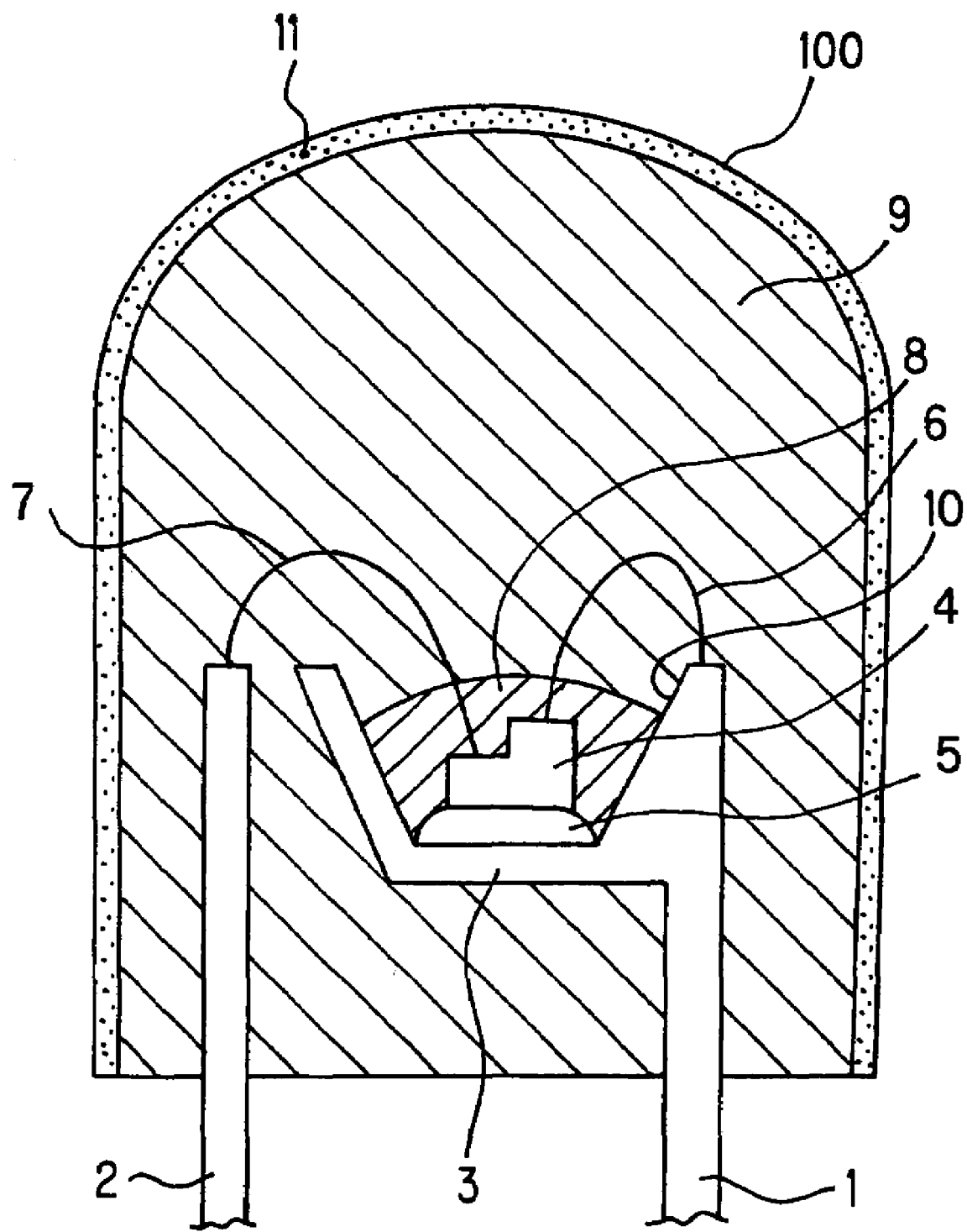
FIG. 8 is a cross-sectional view showing a semiconductor light emitting device in a sixth preferred embodiment according to the invention.

FIG. 8 shows a semiconductor light emitting device according to the sixth preferred embodiment of the present invention.

The semiconductor light emitting device shown in FIG.8, in which a light emitted from a light emitting element is wavelength-converted and radiated to the outside of a lens-shaped resin sealant, comprises lead frames 1, 2, a metal stem 3, a blue LED 4, a mount 5, bonding wires 6, 7, an internal resin 8 not containing a phosphor 11, an external resin 9, a cup 10, and further comprises a phosphor cover 100 which is transparent.

Still, the phosphor cover 100 is made of, for example, a resin backing material containing the phosphor 11, which generates fluorescence when the phosphor 11 is excited by a light emitted from the blue LED 4. The resin backing material is, for instance, transparent polyester resin, acrylic resin, urethane, nylon, silicone resin, chloroethylene, polystylene, bakelite, CR39 (acryl glycol carbonate resin), etc. Since urethane, nylon and silicone resin add some elasticity to the phosphor cover 100, mounting thereof on the external resin 9 will be easier.

Further, the phosphor cover 100 is shaped to adhere to the outer surface of the external resin 9, that is, shaped into a solid construction with a semispherical cover integrated into the upper part of a cylindrical cover, and mounted detachably onto the external resin 9. Moreover, the phosphor cover 100 is preferably a thin film so as to reduce the light scattering due to the phosphor 11. Furthermore, the phosphor cover 100 can be fabricated relatively easily, when a resin containing the phosphor 11 is shaped into a predetermined form by injection molding then adhered to the external resin 9. However, the phosphor cover 100 may be fabricated by spraying a resin material containing the phosphor 11 directly onto the external resin 9 and curing the resin material, so that air gap does not appear between the external resin 9 and the phosphor cover 100.

In the semiconductor light emitting device with the above structure, a light emitted from the blue LED 4 is incident to the phosphor cover 100 via the internal resin 8 and the external resin 9. A part of the incident light is absorbed by the phosphor 11, and simultaneously emitted to the outside after wavelength conversion. Accordingly, the color of the emitted light that is observed from outside the phosphor cover 100 becomes the color synthesizing the lights, such as white according to the aforementioned principle, for instance.

Thus, according to the sixth preferred embodiment of the semiconductor light emitting device, the light scattering due to the phosphor 11 will not occur in the internal resin 8 and the external resin 9, because the internal resin 8 and the external resin 9, which are resin sealants of the blue LED 4, do not contain the phosphor 11, while the phosphor cover 100 for covering the external surface of the external resin 9 contains the phosphor 11. Further, since the phosphor cover 100 is shaped to be a thin film, the light scattering due to the phosphor 11 is relatively small. Accordingly, by shaping the lens portion of the external resin 9 into an arbitrary form (which is semispherical in this preferred embodiment), a desired light directivity can be obtained so that decrease in luminance accompanied with wavelength conversion can be suppressed to minimum.

Beyond that, by changing a type of the phosphor 11 that is contained in the backing material of the phosphor cover 100, emitted lights with colors other than white can be realized. When the phosphor cover 100 has an easy-to-detach structure and several types of the phosphor cover 100 containing different types of the phosphor 11 are prepared, a color tone of emitted light can be varied easily by changing the phosphor cover 100.

Further, the similar effect can be obtained when the phosphor 11 is applied on the surface of the phosphor cover 100 instead of being contained in the phosphor cover 100. Moreover, since the phosphor cover 100 can be mounted on a commercially available semiconductor light emitting device, the semiconductor light emitting device can be fabricated at a low cost.

INDUSTRIAL APPLICABILITY

As described above, the light emitting device comprising a light emitting element and a phosphor according to the present invention is suitable for an LED display, a backlight device, a signal, an illuminated switch, various sensors and various indicators.

What is claimed is:

1. A light emitting device, comprising:
    a light emitting element comprising a nitride semiconductor; and
    a phosphor which can absorb a part of light emitted from said light emitting element and can emit light or a wavelength different from that of said absorbed light,
    wherein the phosphor comprises an alkaline earth metal orthosilicate activated by a divalent europium, and an alkaline earth metal aluminate activated by a divalent europium and/or manganese.

2. The light emitting device according to claim 1, wherein:
    the phosphor comprises a divalent-europium-activated alkaline earth metal silicate represented by the formula:

(2-x-y) SrO x(Ba, Ca)O (1-a-b-c-d) SiO$_2$.aP$_2$O$_5$ bAl$_2$O$_3$cB$_2$O$_3$dGeO$_2$: y Eu$^{2+}$ wherein 0<x<1.6,
    0.005<y<0.5, and
    0≦a, b, c, and d<0.5, and/or
    a divalent-europium-activated alkaline earth metal silicate represented by the formula:

(2-x-y) BaO x(Sr, Ca)O (1-a-b-c-d) SiO$_2$.aP$_2$O$_5$ bAl$_2$O$_3$cB$_2$O$_3$dGeO$_2$: y Eu$^{2+}$ wherein 0.01<x<1.6,
    0.005<y<0.5, and
    0≦a, b, c, and d<0.5.

3. The light emitting device according to claim 1, further comprising:
    a transparent optical guide plate that comprises an optical connection face that is optically connected with the light emitting element, and a light-emitting face that light emitted from the light emitting element passes through;
    a casing that covers a face of the optical guide plate other than the light-emitting face, the casing being provided with a reflection member inside thereof; and
    a transparent film that is provided on the light-emitting face,
    wherein the transparent film comprises phosphor.

4. The light emitting device according to claim 1, further comprising:
    an insulating substrate that is provided with a wiring pattern for-med-thereon, the light emitting element being mounted on the insulating substrate and wire-bonded to the wiring pattern;
    a cup that is mounted on the insulating substrate while surrounding the light emitting element; and
    a transparent sealing member that is filled inside the cup to cover the light emitting element,
    wherein the transparent sealing member comprises the phosphor.

5. The light emitting device according to claim 1, further comprising:
    a lead frame that is provided with a cup;
    an overvoltage protection element that is mounted on the bottom of the cup and is provided with electrodes formed thereon, the light emitting element being flip-chip mounted on the overvoltage protection element while being electrically connected to the light emitting element through the electrodes thereof; and
    a transparent sealing member that is filled inside the cup to cover the light emitting element,
    wherein the transparent sealing member comprises the phosphor.

6. The light emitting device according to claim 1, further comprising:
    a lead frame that is provided with a cup, the light emitting element being mounted on the bottom of the cup;
    a transparent sealing member that is provided to seal the inside of the cup and the periphery of the lead frame, and
    a transparent phosphor cover that is formed on the outer surface of the transparent sealing member,
    wherein the transparent phosphor cover comprises the phosphor.

7. A light emitting device comprising:
    a light emitting element comprising a nitride semiconductor, wherein said light emitting element emits light having a peak light-emitting wavelength of between about 380 and about 500 nanometers; and
    a mixture of at least two different phosphors described by the formula:

(SR$_{(1-x-y)}$Ba$_x$Ca$_y$)$_2$Si$_{(1-a-b-c-d)}$P$_a$Al$_b$B$_c$Ge$_d$) O$_4$:Eu$^{2+}$ wherein 0<x<0.8, 0≦y<0.8, 0<x+y<1, 0≦a,b,c<0.25, 0≦d<0.5, 0≦a+b+c+d<1.

8. The light emitting device according to claim 7, wherein:
    said phosphor is mixed into a covering member which covers said light emitting element.

9. The light emitting device according to claim 8, wherein:

said covering member comprises a silicon resin.

10. The light emitting device according to claim 8, wherein:

said covering member comprises a low-melting glass.

11. The light emitting device according to claim 7, wherein:

said phosphor is mixed with a covering member which covers said light emitting element and a scattering agent is also mixed with the covering member.

12. The light emitting device according to claim 7, wherein:

said light emitting element comprises a light emitting layer containing indium.

13. The light emitting device according to claim 7, wherein:

said light emitting element includes a double hetero structure comprising a light emitting layer sandwiched between a p-type clad layer and an n-type clad layer.

* * * * *

UNITED STATES PATENT AND TRADEMARK OFFICE
CERTIFICATE OF CORRECTION

PATENT NO. : 7,138,660 B2
APPLICATION NO. : 11/087579
DATED : November 21, 2006
INVENTOR(S) : Koichi Ota et al.

It is certified that error appears in the above-identified patent and that said Letters Patent is hereby corrected as shown below:

Title Page

(73) Assignees:

Please correct the residence of the 4th Assignee, Leuchstoffwerk Breitungen GmbH, from:

Breitunge (DE) to Breitungen (DE).

Signed and Sealed this

Sixth Day of February, 2007

JON W. DUDAS
*Director of the United States Patent and Trademark Office*